United States Patent [19]
Varshney et al.

[11] Patent Number: 5,850,089
[45] Date of Patent: Dec. 15, 1998

[54] MODULATED-STRUCTURE OF PZT/PT FERROELECTRIC THIN FILMS FOR NON-VOLATILE RANDOM ACCESS MEMORIES

[75] Inventors: Usha Varshney, Radford, Va.; Angus Ian Kingon, Cary, N.C.

[73] Assignee: American Research Corporation of Virginia, Radford, Va.

[21] Appl. No.: 852,078

[22] Filed: Mar. 13, 1992

[51] Int. Cl.$^6$ ............ H01L 29/76; H01L 29/74; H01L 31/062; H01L 31/113
[52] U.S. Cl. ............ 257/295; 257/22; 257/183
[58] Field of Search .................. 257/415, 421, 257/422, 196, 183, 22, 295

[56] References Cited

U.S. PATENT DOCUMENTS

| | | |
|---|---|---|
| 3,963,630 | 6/1976 | Yonezawa et al. . |
| 4,760,556 | 7/1988 | Deguchi et al. ........................ 257/315 |
| 4,990,324 | 2/1991 | Tomita et al. . |
| 5,188,902 | 2/1993 | Lin .......................................... 428/426 |
| 5,246,610 | 9/1993 | Banno et al. . |

OTHER PUBLICATIONS

Neurgaonkar, R. R. Annual Report to ONR on Contract No.: N00014–81–C–0463 (1988) no month.
Bondurant, "Ferroelectric RAM Memory Family for Critical Data Storage," pp. 212–215 no date.
Swartz, "Topics in Electronic Ceramics," 25 IEEE Transactions on Electrical Insulation 935–987 (1990) no month.
Dey et al., "Processing and Parameters of Sol–Gel PZT Thin–Films for GaAs Memory Applications," pp. 189–194 no date.
Saenger et al., "Lead Zirconate Titanate Films Produced by Pulsed Laser Deposition," IBM Research Report (1990) no month.
Ramkumar et al., "Ferroelectric Thin Films Deposited by Laser Ablation," Rutgers University no date.
Chiang et al., "Lead Zirconate–Titanate Thin Films Prepared by the Laser Ablation Technique," Mat. Res. Soc. Symp. Proc. vol. 200, pp. 133–137 (1990) no month.
Minamikawa et al., "Effect of Pulsed Laser Irradiation in Preparation of Pb $(Zr_{0.52} Ti_{0.48})O_3$ Films by Laser Ablation," pp. 304–307 no date.
Saenger et al., "Lead Zirconate Titanate Films Produced by Pulsed Laser Deposition," IBM Research Division no date.
Etzold et al., "Substrate Effects in In–Situ Growth of Perovskites by Pulsed Laser Deposition," IBM Research Division (1991) no month.
Krupanidhi et al., "Growth of Ferroelectric Oxide Thin Films by Excimer Laser Ablation," Pennsylvania State University, Abstract #1121 (1992) no month.
Krupanidhi et al., "Growth of Ferroelectric Oxide Thin Films by Excimer Laser Ablation," J. Vac. Sci. Technol. A 10(4), pp. 1815–1820 no date.
Roy et al., "Excimer Laser Ablation of Ferroelectric Pb(Zr, Ti)$O_3$ Thin Films With Low Pressure Direct–Current Glow Discharge," J. Vac. Sci. Technol. A10(4), pp. 1827–1831 (1992) no month.
Krupanidhi et al., "Pulsed Excimer Laser Deposition of Ferroelectric Thin Films," 1 Integrated Ferroelectrics 253–268 (1992) no month.
Roy et al., Excimer Laser Ablated Lead Zirconate Titanate Thin Films, 69 J. Applied Physics 7930–7932 (1991) no month.
Chiang et al., Post–Processing of Pulsed Laser–Deposited PZT Thin Films (1991) no month.

*Primary Examiner*—Ngân V. Ngô
*Attorney, Agent, or Firm*—James Creighton Wray; Meera P. Narasimhan

[57] ABSTRACT

Modulated-structure polycrystalline or heteroepitaxial multilayers of PZT/PT ferroelectric thin films are deposited on a substrate, preferably by laser ablation. The laser ablation of the PZT/PT layers onto a prepared substrate occurs while maintaining the substrate at a temperature between 380° C. to about 650° C. The target source for the PZT/PT laser ablated film may be either bulk PZT and PT ceramics or powders or individual metal oxides or metal pellets. The ferroelectric thin film device may be used for a random access memory.

8 Claims, 2 Drawing Sheets

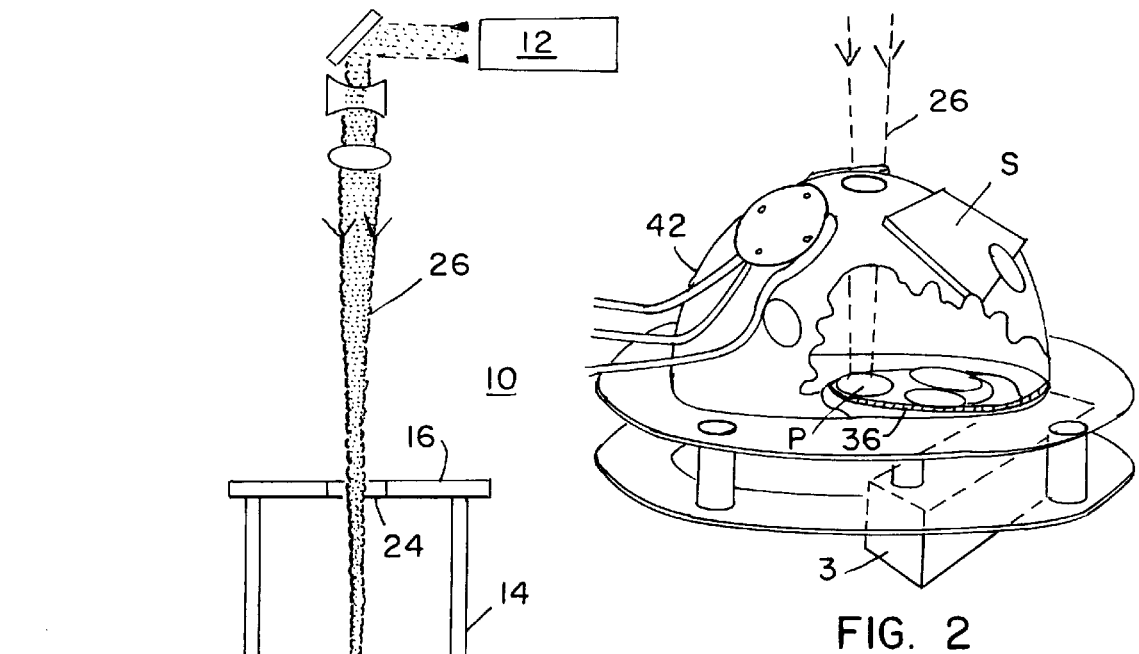
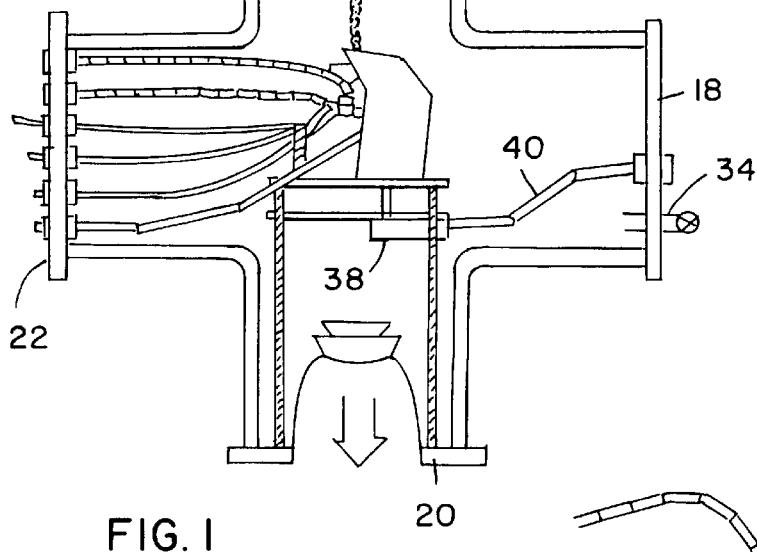
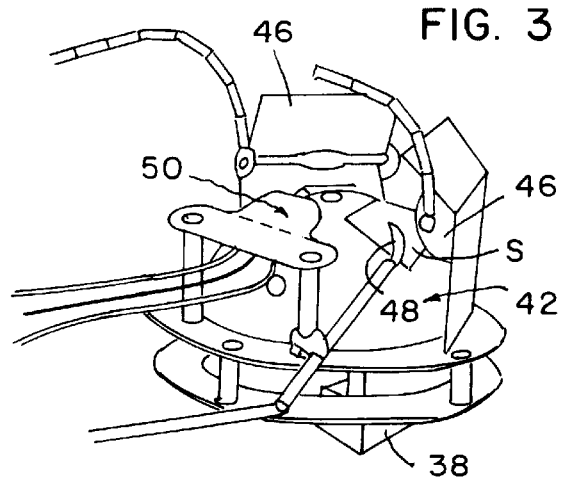
FIG. 1
FIG. 2
FIG. 3

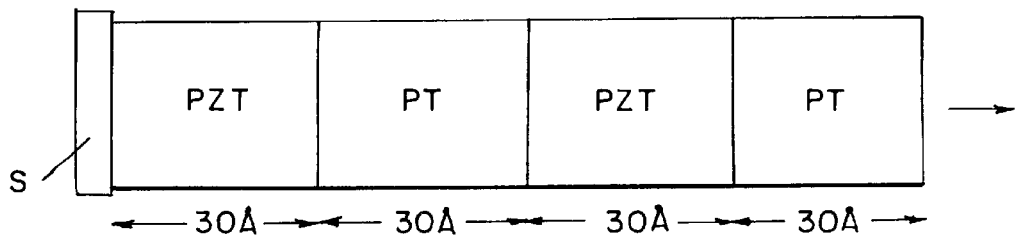
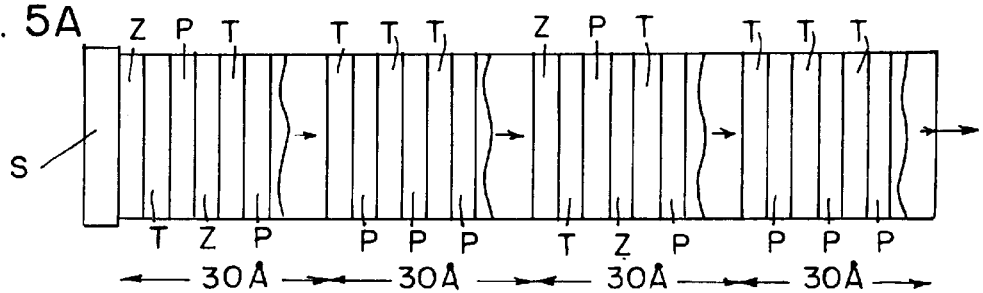
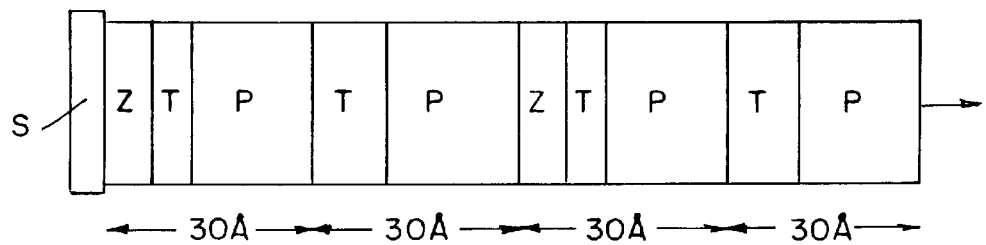
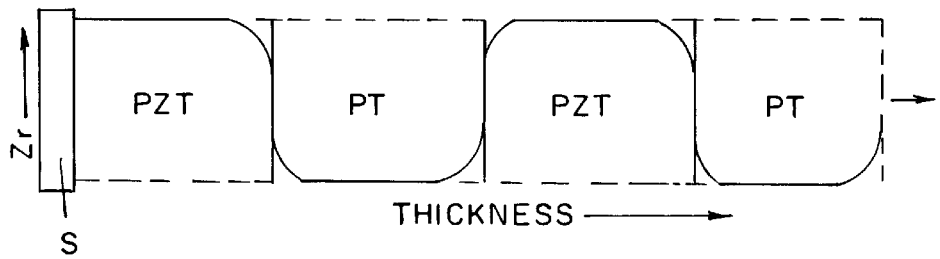

MODULATED-STRUCTURE OF PZT/PT FERROELECTRIC THIN FILMS FOR NON-VOLATILE RANDOM ACCESS MEMORIES

BACKGROUND OF THE INVENTION

Pure crystalline lead, zirconate titanate (PZT) has a perovskite structure having cubic symmetry only above the Curie point (350° C. for $PbZr_{0.5}Ti_{0.50}O_3$ and 490° C. for lead titanate). Below the Curie temperature, the perovskite cell is distorted to yield structures with tetragonal or rhombohedral symmetry, which display ferroelectricity. Continuous solid solution exists between $PbZrO_3$ and $PbTiO_3$. Pure $PbTiO_3$ (PT) has a tetragonal perovskite structure and is ferroelectric, whereas pure $PbZrO_3$ has an orthorhombic structure and is antiferroelectric. The PZT solid solution system exhibits a morphotropic (i.e., almost temperature independent) phase boundary between the phases with tetragonal and rhombohedral symmetry. This boundary occurs at approximately 53.5 mole % $PbZrO_3$. At the morphotropic phase boundary region, a mixture of tetragonal and rhombohedral phases can coexist.

Ferroelectric thin films formed of lead zirconate titanate (PZT) provide a number of advantages in connection with the construction of computer memories, including but not limited to high bit-density, non-volatility, low-voltage operation over a wide temperature range, high speed, short access and cycle times, and relatively high radiation hardness. However, it has heretofore been difficult to satisfactorily deposit ferroelectric thin films on the temperature sensitive substrates (such as Si and GaAs) typically used in integrated circuits.

The use of ferroelectric thin films for non-volatile, random access memories has been reviewed by Bondurant, First Symp. on Intg. Ferroelect., Univ. Co., pp. 212–25 (1989), and Swartz, IEEE Transactions in Elect. Insul., 25, No. 5, pp. 953–87 (1990), who presented a rationale for using PZT as the material of choice. Dey et al., First Symp. on Intg. Ferroelect. Univ. Co., pp. 189–94 (1989), discussed methods for the fabrication of ferroelectric PZT thin films and compared vacuum methods, including flash and electron beam evaporation, RF diode and magnetron sputtering or ion beam sputter deposition, with organometallic or sol-gel processing techniques.

Laser ablation methods of depositing PZT thin film materials have been reported by Saenger et al., Materials Sci., RC 15822 (170169) May 12, 1990, IBM Research Division, T. J. Watson Res. Cntr., and Neurgaonkar, Ann. Rpt. to ONR Contract No. NOOON-81-C-0463 (1988). Ramkumar et al., Ferroelectric Thin Films Deposited by Laser Ablation (preprint) (1990), showed thin films with excess Pb and significant amounts of Ti, but insufficient Zr when fabricated from a target of bulk PZT using a $CO_2$ laser ($\lambda$=10.6 um), whereas there was a Pb deficiency in the films made by excimer laser ($\lambda$=248 um) ablation. Similar results have been reported by Krupanidhi et al., Excimer Laser Ablated PZT Thin Films, Journal of Applied Physics, Vol. 69, No. 11, pp. 7930–32 (1991), using an excimer laser to fabricate PZT. Chiang et al., Lead Zirconate-Titanate Thin Films Prepared by the Laser Ablation Technique (1990), prepared lead zirconate titanate films by irradiating PZT targets with a focused Q-switched Nd:YAG laser (15 ns, 100 mJ and $\lambda$=1.064 um), and observed the as-deposited films to be amorphous. Minamikawa et al., Effect of Pulsed Laser Irradiation in Preparation of $Pb(Zr_{0.52}, Ti_{0.48})O_3$ Films by Laser Ablation (1990), found that laser irradiation of the growing film surface during deposition enhances the formation of perovskite structure and decreases the roughness of the film.

SUMMARY OF THE INVENTION

The present invention overcomes the problems of the prior art by providing low temperature as-deposited crystalline ferroelectric thin film on temperature sensitive semiconductor substrates using laser ablation techniques, and improves speed, reliability and performance by providing modulated PZT and PT heterostructure ferroelectric thin films for use in non-volatile random access memories.

The performance of a memory device is a function of its signal charge (i.e., its current-versus-time characteristics) and its coercive field (i.e., the voltage required for switching). A high performance memory device has a high signal charge and a low coercive field. Thus, the quality of a ferroelectric film to be used in a memory device is determined by its dielectric constant, K, its switching (coercive) field, $E_c$, and its remanent polarization, $P_r$. A low dielectric constant, K, is desirable as it increases the ratio of switched to unswitched charge. $P_r$ is a particularly important parameter in memory applications since it determines the maximum signal available when the ferroelectric material is switched.

A memory device formed of a modulated PZT and PT heterostructure ferroelectric thin film utilizes the ferroelectric advantages of both PZT and PT. PZT has a low $E_c$. PT has a high $P_r$ and low K. Thus, the modulated structure ferroelectric thin films of the present invention require low switching fields primarily determined by the PZT layers to yield signal charge which is improved by the large spontaneous polarization of the PT layer.

The multilayer PZT/PT ferroelectric thin films of the present invention are preferably fabricated by laser ablation. The use of laser ablation allows for reliable deposition of alternating PZT/PT layers at temperatures that are low enough to be compatible with temperature sensitive semiconductor substrates such as silicon and gallium arsenide. However, a thin film in accordance with the present invention may be fabricated by a technique other than laser ablation.

The use of laser ablation is preferred because it produces a plume with high energy atomic species, preferably with energies in the range of 100–200 eV. The high energy atomic species have high surface mobility on the substrate, permitting the fabrication of high quality, well-crystallized films at low substrate temperatures. Applicants have discovered that the atomic species produced in the plume by laser ablation at 20 J/cm$^2$ (as contrasted with the 1–5 J/cm$^2$ reported in the literature) have high energies. Higher laser energy densities of 20 J/cm$^2$ increased the kinetic temperature of the depositing species, thereby resulting in crystalline films at low deposition temperatures.

Further, the use of laser-ablation at relatively low substrate temperatures will allow short range interdiffusion while minimizing long range interdiffusion between the ferroelectric thin film and a buffer layer provided on the substrate, and interdiffusion between the top and bottom electrodes with the ferroelectric film and the substrates.

With the present invention, highly oriented large grain polycrystalline or hetero-epitaxial modulated structure ferroelectric thin films can be produced at deposition temperatures as low as 450° C. The modulated structure thin films will have improved speed, reliability, performance, aging and fatigue properties as well as improved retention characteristics, which when combined with a thermally sensitive semiconductor substrate will enable the production of non-volatile ferroelectric random access memories.

Other features of the present invention will be apparent from the following detailed description and the drawings.

BRIEF DESCRIPTION OF THE DRAWINGS

FIG. 1 is a cross-sectional view of a laser ablation deposition reactor in accordance with the present invention.

FIG. 2 is a perspective view of a substrate holder and target rotation table for the reactor of FIG. 1.

FIG. 3 is another perspective view of the substrate holder of FIG. 2.

FIG. 4 is a schematic representation of a modulated structure ferroelectric thin film device constructed in accordance with the present invention by ablating bulk PZT and PT ceramics or powders.

FIG. 5(a) is a schematic illustration of a deposition sequence for the modulated structure ferroelectric thin film device of FIG. 4 fabricated by ablating individual oxides or metals.

FIG. 5(b) is a schematic illustration of another deposition sequence for the modulated structure ferroelectric thin film device of FIG. 4.

FIG. 6 is a schematic illustration of the zirconium concentration within the modulated thin film device of FIG. 4, as a function of modulation thickness.

DETAILED DESCRIPTION OF PREFERRED EMBODIMENTS

A laser ablation deposition reactor 10 for fabricating the modulated PZT and PT heterostructure ferroelectric thin film of the present invention is illustrated in FIG. 1. The laser reactor 10 is formed of a laser 12 and a quartz tube 14 with four ports 16, 18, 20 and 22. A beam 26 from the laser 12 passes through a window 24 and is focused on a target, ablating the target such that the ablated material is deposited on a substrate S (FIG. 2). In the preferred embodiment, the target is formed of individual PbO, $ZrO_2$ and $TiO_2$ pellets (FIG. 3) indicated by reference characters P, Z, T, respectively.

FIG. 4 is a representation of a modulated structure ferroelectric thin film fabricated by ablating bulk PZT and PT ceramics or powders.

To form the modulated structure ferroelectric thin film of metal oxide pellets, the individual pellets P, Z, T are ablated by the laser beam 26 in the order schematically illustrated in FIG. 5(a). In particular, a PZT layer is deposited onto the substrate S by successively ablating the pellets in the following order: Z, then T, then P, with this order being repeated a number of times depending on the thickness of the film. Then, a PT layer is formed on top of the PZT layer by successively ablating the P and T pellets (without ablating the Z pellet). Another PZT layer is then deposited on top of the PT layer, and so on.

FIG. 5(b) illustrates another preferred deposition sequence. According to the sequence illustrated in FIG. 5(b), each PZT layer may be formed by depositing a Z layer 7.8 Å thick, then a T layer 6.3 Å thick, and then a P layer 16.1 Å thick, for a total thickness of 30 Å. Each PT layer may be formed by depositing a P layer 16.5 Å thick and a T layer 13.4 Å thick, for a total thickness of 30 Å.

A modulated structure thin film device deposited according to the sequences illustrated in FIGS. 4, 5(a) and/or 5(b) is schematically illustrated in FIG. 6. An exemplary 1800 Å, 1.27 cm diameter modulated structure thin film will have 60 modulated layers each 30 Å thick, following any of the deposition sequences shown in FIGS. 4, 5(a) and 5(b).

As explained below, the present invention is not limited to the ablation of individual metal oxide pellets. A modulated structure in accordance with the present invention can also be fabricated by ablating bulk PZT and PT powders or ceramics, or by ablating metals (Pb, Zr and Ti) and by performing a post-annealing and oxidation treatment.

The PZT layer is preferably formed next to the substrate (or contact layer) S due to the low switching field characteristics, and the individual oxide pellets are preferably ablated in the order illustrated in FIGS. 4, 5(a) and/or 5(b) due to the interdiffusion limits of the oxides. However, the present invention is not limited to the specific deposition sequences described herein. Other deposition sequences may be employed depending on the desired parameters.

As illustrated in FIG. 2, the target pellets Z, T, P are supported on a rotation table 36, which is connected through a gearbox 38 to a motor-driven universal joint 40 (FIG. 1). In operation, the table 36 is rotated to sequentially ablate the different metal oxides, either all three of the oxides to deposit a PZT layer, or only the P and T pellets to deposit a PT layer. The rotation of the individual target on table 36 insures the exposure of fresh target area to minimize differential ablation effects. The rotation of the table 36 may be manually controlled or it may be computer controlled.

The port 20 (FIG. 1) is connected to a combined diffusion and rotary pump which can evacuate the interior of the reactor 10 to $2 \times 10^{-7}$ Torr prior to and during the film deposition process. There is a gas inlet 34 for regulating oxygen-partial pressure in the interior reactor 10 during evaporation.

As can be seen in both FIGS. 2 and 3, a hemispherical fixture 42 holds the substrate S above the target pellets P, Z, T (or PZT and PT powder or ceramics), preferably about 5 cm above the target.

Heating sources 46 (e.g., tungsten quartz halogen lamps) heat the substrate S, and the temperature is recorded by a chromel-alumel thermocouple 48. The heating sources 46 should be capable of h eating the substrate S from room temperature to approximately 900° C. The thickness of the film deposited on the substrate S is recorded by a thickness monitor 50 which has a watercooling attachment.

The type of laser used for ablation may vary as long as precise control of the laser parameters can be achieved. $CO_2$, Excimer, and Nd:YAG lasers are suitable for use in the present invention. Further, the laser can be operated in either a continuous or a pulsed mode. Preferably, the reactor 10 is provided with correction optics for focussing the laser beam 26 onto the target.

The thickness of the individual PZT and PT layers and the thickness of the entire modulated thin film are determined by the requirements of the memory device. The net polarization of the thin film is dependent on the thickness of its layers. Typically, the thin film thicknesses will range from 0.1 to 0.4 um.

Preferably, each modulation dimension is determined such that it is greater than the critical nucleation radius, which is estimated to be about 20–30 Å (equivalent to a few unit cells of the PZT structure), yet small enough that the low switching field of the PZT layer is combined with the large spontaneous polarization of the PT layer to provide large signal charge at low switching voltages. At these small heterostructure dimensions there is a possibility of homogeneous nucleation and growth of the switched regions in the PZT layers. A memory device formed of the thin film will therefore have increased speed and reliability.

Individual elemental oxide layer thicknesses should preferably be calculated for a stoichiometric PT and PZT composition of $PbTiO_3$ and $Pb(Zr_xTi_{1-x})O_3$ for a Zr/Ti atomic percent ratio of approximately 53/47. PZT ceramic compositions near the morphotropic phase boundary have a significant advantage. Near the boundary, there are a series of metastable states available which allow the switching to occur with several intermediate structural configurations. The spontaneous polarization within each grain (or domain) can be switched to one of the 14 possible orientations (the eight [1-1-1] directions of the rhombohedral unit cell and the six [1-0-0] directions of the tetrahedral unit cell). For this reason, the piezoelectric properties of PZT ceramics are exceptionally high near the morphotropic phase boundary.

For analysis and characterization of the PZT/PT thin film structures, some of the metallographic techniques include but are not limited to X-ray diffraction, energy dispersive X-ray analysis, Auger electron spectroscopy, scanning electron microscopy, Rutherford backscattering spectroscopy and parallel plate capacitor configuration.

Ferroelectric alternating PZT/PT films formed according to the above-described process using a Nd:YAG laser, at a substrate temperature of about 450° C., a chamber pressure of $5 \times 10^{-4}$ Torr, an energy density of 20 J/cm$^2$ and a pulse repetition rate of 5 kHz were analyzed for the effects of metal oxide stoichiometric ratios. The results of the analysis are depicted in Table 1. As shown in Table 1, the desired phases occur when the Z:T:P stoichiometric ratio is 2:2:1.

A preferred embodiment of the invention, i.e., a modulated PZT/PT heterostructure ferroelectric thin film with large $P_r$ and low $E_c$ was formed according to the conditions described in the last column of Table I.

TABLE I

FERROELECTRIC THIN FILMS AS A
FUNCTION OF METAL OXIDES STOICHIOMETRIC RATIOS

| SAMPLE | PZT | PZT/PT/PZT |
|---|---|---|
| Thick of Layers (Å) | 3500 | 902/3032/908 |
| Stoichiometric Ratio Z:T:P | 3:3:1 | 2:2:1 |
| Substrate Temperature (°C.) | 525 | 450 |
| Chamber Pressure (Torr) | $1 \times 10^{-4}$ | $5 \times 10^{-4}$ |
| Atomic Percent Ratio Zr/Ti | 55/45 | 50.1/49.9 |
| Phases Present | Strong PZT + PbO Tetragonal | Tetragonal + Rhombohedral |

The present invention is not limited to the use of individual metal oxide pellets. The target source may be formed of bulk PZT and PT powders or bulk PZT and PT ceramics, or individual metals (Pb, Zi, Ti) which are oxidized and post-annealed after deposition. When bulk powders are selected as the target source, they are ablated in order such that a PZT layer is formed next to the substrate or contact layer, then a PT layer is formed next to the PZT layer, then a PZT layer is formed next to the PT layer, and so on, as illustrated in FIG. 6. The ferroelectric properties of PZT/PT dictate the modulated structure. PZT composition close to the morphotropic phase boundary has the lowest $E_c$ as compared to the other composition away from the morphotropic phase boundary, and therefore nucleates relatively easily when placed nearer the semiconductor substrate.

Bulk PZT and PT powders for use in the present invention may be fabricated by ceramic techniques which involve grinding, melting, calcination and slow cooling in air. To form the PZT powder, stoichiometric amounts of analytical grade metal oxides of zirconium and titanium ($ZrO_2$ and $TiO_2$) are wet blended with acetone in an attritor. The ground powder is dried and calcined at 1100° C. for 4 hours in order to reduce shrinkage during final firing. After calcination a second grinding is preferably used to break up agglomerates formed during calcination and a stoichiometric amount of PbO is added. Adding the PbO after calcining the $ZrO_2$ and $TiO_2$ is important because it prevents PbO volatilization. The powder is mixed and further ground to a homogeneous average particle size of 1–5 um. The final powder is calcined at 850° C. for 6 hours and cooled at a rate of 100° C./hr. to room temperature in air. Advantageously, the above-described two-step high and low temperature sintering process prevents PbO depletion in the formed powder. Fabrication of PZT and PT ceramics have been reported by A. I. Kingon and J. B. Clark, J. Am. Cer. Society, vol. 66, No. 4, pp. 253–56, 256–60 (1983).

The laser ablation technique described herein succeeds in lowering the deposition temperature of the as-deposited, alternating PZT/PT ferroelectric thin film layers to about 450° C. This low deposition temperature makes ferroelectric thin film technology compatible with thermally sensitive semiconductor substrates such as Si and GaAs.

A memory device formed of a modulated PZT and PT heterostructure ferroelectric thin film in accordance with the present invention will be non-volatile because a switched region of thin film will remain in its polarization state when the switching voltage is removed. The modulated PZT/PT heterostructure ferroelectric thin films of the present invention will be suitable for use in radiation-hard, non-volatile random access memories, and will improve speed, reliability, performance and retention characteristics of such memories, and will have improved aging and fatigue properties.

While the invention has been described with reference to specific embodiments, it will be apparent to those skilled in the art that many alternatives, modifications, and variations may be made. Accordingly, it is intended to embrace all such alternatives, modifications and variations that may fall within the spirit and scope of the appended claims.

What is claimed is:

1. A ferroelectric thin film structure comprising a substrate and a modulated lead zirconate titanate and PbTiO$_3$ heterostructure ferroelectric thin film formed on said substrate.

2. The structure of claim 1, wherein said modulated structure is deposited onto said substrate.

3. The structure of claim 1, wherein said substrate is formed of a material selected from the group consisting of Si and GaAs.

4. The structure of claim 1, wherein said structure is fabricated by a method comprising the steps of: preparing said substrate for film deposition; and depositing said modulated heterostructure ferroelectric thin film onto said substrate.

5. The structure of claim 4, wherein said substrate is formed of a semiconductor material selected from the group consisting of Si and GaAs.

6. The structure of claim 4, wherein said thin film deposition step includes the step of directing laser energy onto a target, said target including a pellet formed of PbO, a pellet formed of ZrO$_2$, and a pellet formed of TiO$_2$.

7. The structure of claim 4, wherein said thin film deposition step includes the step of directing laser energy onto a target, said target including a pellet formed of Pb, a pellet formed of Zr, and a pellet formed of Ti, and wherein said method includes a post-oxidation step.

8. The structure of claim 4, wherein said thin film deposition step includes the step of directing laser energy onto a target, said target including bulk lead zirconate titanate powder or ceramic and bulk PbTiO$_3$ powder or ceramic.

* * * * *

UNITED STATES PATENT AND TRADEMARK OFFICE
CERTIFICATE OF CORRECTION

PATENT NO. : 5,850,089
DATED : December 15, 1998
INVENTOR(S) : Varshney et al.

It is certified that error appears in the above-identified patent and that said Letters Patent is hereby corrected as shown below:

Column 1,
Before line 4, "BACKGROUND OF THE INVENTION" insert the following paragraph:

-- This invention was made with Government support under Contract No. DASG 60-91-C-0153 awarded by the U.S. Army Space and Missile Defense Command. The Government has certain rights in the invention. --

Signed and Sealed this

Tenth Day of August, 2004

JON W. DUDAS
*Acting Director of the United States Patent and Trademark Office*